United States Patent
Meguro et al.

(10) Patent No.: US 7,643,365 B2
(45) Date of Patent: Jan. 5, 2010

(54) SEMICONDUCTOR INTEGRATED CIRCUIT AND METHOD OF TESTING SAME

(75) Inventors: Tetsumasa Meguro, Tokyo (JP); Yoshikazu Kurose, Tokyo (JP)

(73) Assignee: Sony Corporation, Tokyo (JP)

(*) Notice: Subject to any disclaimer, the term of this patent is extended or adjusted under 35 U.S.C. 154(b) by 780 days.

(21) Appl. No.: 11/117,299

(22) Filed: Apr. 29, 2005

(65) Prior Publication Data
US 2005/0254325 A1 Nov. 17, 2005

(30) Foreign Application Priority Data
May 11, 2004 (JP) ............... 2004-141614

(51) Int. Cl.
*G11C 5/14* (2006.01)
(52) U.S. Cl. ............... 365/226; 365/227; 365/228
(58) Field of Classification Search ............... 365/226, 365/227, 228, 229, 201; 345/211; 713/600
See application file for complete search history.

(56) References Cited

U.S. PATENT DOCUMENTS

| | | | | |
|---|---|---|---|---|
| 6,385,119 | B2* | 5/2002 | Kobayashi et al. | ........... 365/227 |
| 2003/0135779 | A1* | 7/2003 | Takashima et al. | ........... 713/600 |
| 2003/0142572 | A1* | 7/2003 | Ishida et al. | ........... 365/226 |
| 2005/0110787 | A1* | 5/2005 | Lin | ........... 345/211 |

FOREIGN PATENT DOCUMENTS

| | | |
|---|---|---|
| JP | 02-199851 | 8/1990 |
| JP | 2000-214221 | 8/2000 |
| JP | 2001-036008 | 2/2001 |
| JP | 2002-505497 | 2/2002 |
| JP | 2002-359289 | 12/2002 |
| JP | 2004-070805 | 3/2004 |

OTHER PUBLICATIONS

Japanese Office Action No. 2004-141614.

* cited by examiner

*Primary Examiner*—Vu A Le
*Assistant Examiner*—Han Yang
(74) *Attorney, Agent, or Firm*—Rader, Fishman & Grauer PLLC

(57) ABSTRACT

A semiconductor integrated circuit able to operate by different power supply voltages resulting from fluctuations in production, provided with a process monitor circuit for obtaining a grasp of a delay characteristic corresponding to the conditions of a production process, a memory circuit for storing data concerning an extent of process variation acquired by the process monitor circuit, and a power supply voltage control circuit for adaptively controlling the power supply voltage in accordance with the extent of process variation acquired by the process monitor circuit and stored in the memory circuit, and a test method for guaranteeing the operation of the semiconductor integrated circuit.

15 Claims, 6 Drawing Sheets

11A

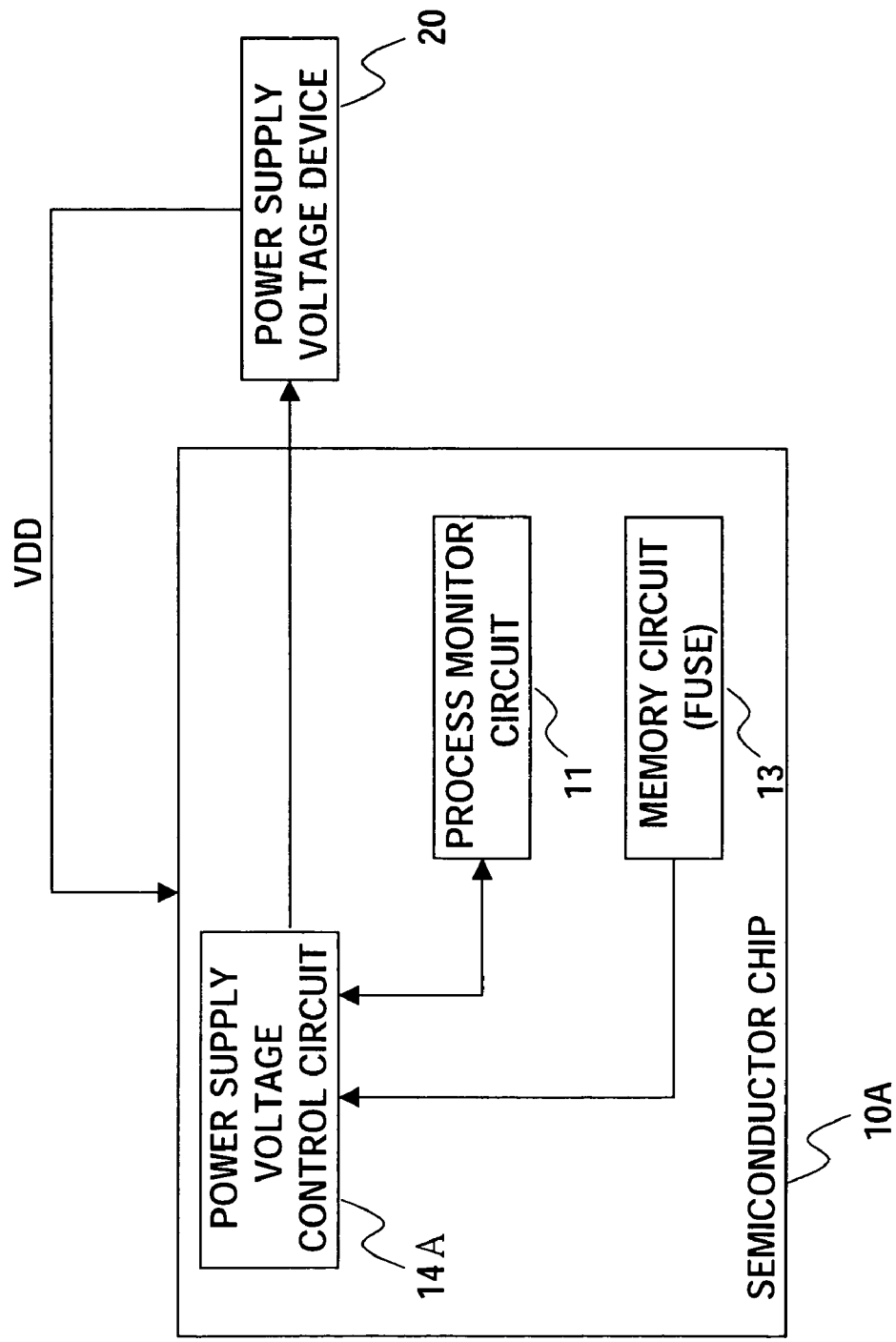

SEMICONDUCTOR INTEGRATED CIRCUIT AND METHOD OF TESTING SAME

CROSS REFERENCES TO RELATED APPLICATIONS

The present invention contains subject matter related to Japanese Patent Application No. 2004-141614 filed in the Japan Patent Office on May 11, 2005, the entire contents of which are incorporated herein by reference.

BACKGROUND OF THE INVENTION

1. Field of the Invention

The present invention relates to a semiconductor integrated circuit and a method of testing the same and, more particularly, to technology providing a mechanism for obtaining a grasp of a delay characteristic inside a semiconductor integrated circuit and adaptively controlling a voltage of supplied power to achieve a reduction of power consumption.

2. Description of the Related Art

In the process of producing semiconductor integrated circuits, variations arise in the characteristics of the principal components of the semiconductor integrated circuits, such as the transistors, the logical gates configured by combinations of the same, and other circuit elements, due to fluctuations in the process conditions.

For example, when considering the case where the threshold voltage of a transistor varies due to such fluctuations in production, the influence thereof appears in the power supply voltage supplied to the produced semiconductor integrated circuit and its operation speed. If produced so that the threshold voltage becomes a value slightly lower than the design value, the operation speed becomes faster. On the other hand, if produced so that the threshold voltage becomes a value slightly higher than the design value, the operation speed becomes slower.

In the shipment tests of produced semiconductor integrated circuits, it is necessary to guarantee their operations and to check the operation at the power supply voltage and the operation frequency in the set product in which the semiconductor integrated circuit is finally mounted. Namely, the shipment test is carried out by the shipment specifications of the power supply voltage and the operation frequency further considering an extra margin in usage. In general, a semiconductor integrated circuit is designed so as to pass this shipment test even if its operation speed becomes slower due to fluctuations in production. For this reason, when the operation speed becomes faster, the semiconductor integrated circuit may often operate at an even faster operation frequency or at an even lower power supply voltage than the shipment specification.

From such a viewpoint, in recent years, a method of adaptively controlling the operation frequency of a semiconductor integrated circuit or the power supply voltage to be supplied in accordance with fluctuations in production has been reported (see Japanese Unexamined Patent Publication (Kokai) No. 2002-505497).

In the technology described in Japanese Unexamined Patent Publication (Kokai) No. 2002-505497, integrated circuits are divided into groups according to their performance at the time of the test. The integrated circuits that are found to operate at faster speeds are designated by the parameter of a faster clock frequency, while the integrated circuits which only operate at slower speeds are designated by the parameter of a slower clock frequency. Integrated circuits produced in the same way, therefore, are given different performance specifications.

In semiconductor integrated circuits such as microprocessors and general purpose memories, products having the same functions but different operation frequencies are therefore sold. Semiconductor integrated circuits having performance specifications matching individual applications of the set products are accordingly selectively mounted. As a result, this grouping according to the clock frequency can be said to be an effective approach.

Japanese Unexamined Patent Publication (Kokai) No. 2001-36008 discloses measuring the delay time of a critical path in a semiconductor integrated circuit, comparing this delay time with a predetermined time, and controlling the power supply voltage so that the delay time becomes faster than the predetermined time.

SUMMARY OF THE INVENTION

With regard to the semiconductor integrated circuits used for specific applications described in Japanese Unexamined Patent Publication (Kokai) No. 2002-505497, however, often there are specifications set for specific purposes of use and grouping according to the operation frequency that are not possible.

Further, the technology described in Japanese Unexamined Patent Publication (Kokai) No. 2001-36008 can reduce the power supply voltage to the operation limits of individual semiconductor integrated circuits, but the supplied power supply voltage differs according to the individual integrated circuits. Therefore, it is a disadvantage that it is not possible to set the same shipment specifications and guarantee of operation by shipment tests is difficult.

In the present invention, it is desirable to provide a semiconductor integrated circuit able to operate with different power supply voltages resulting from fluctuations in production of the integrated circuits and a method of testing for guaranteeing its operation.

According to a first aspect of an embodiment of the present invention, there is provided a semiconductor integrated circuit operating by the supply of a power supply voltage having a process monitor circuit for obtaining a grasp of a delay characteristic corresponding to the conditions of the production process, a memory circuit for storing data relating to an extent of process variation acquired by the process monitor circuit, and a power supply voltage control circuit for adaptively controlling the power supply voltage in accordance with the extent of process variation acquired by the process monitor circuit and stored in the memory circuit.

Preferably, the power supply voltage control circuit has a function of reading the data written in the memory circuit, calculating the power supply voltage to be supplied, and requesting the calculated power supply voltage to an external power supply voltage device.

Preferably, the power supply voltage control circuit has a function of starting up the process monitor circuit and reading the data of the extent of process variation acquired from the process monitor circuit and a function of calculating the power supply voltage to be supplied on the basis of the data read out from the memory circuit and the data read out from the process monitor circuit and requesting the calculated power supply voltage to the external power supply voltage device.

Preferably, a clock of predetermined frequency is supplied, and the power supply voltage control circuit calculates the power supply voltage to be supplied from the clock frequency supplied to the semiconductor integrated circuit in addition to the data written in the memory circuit.

Preferably, the power supply voltage control circuit is programmable and able to be changed in the processing for calculating the power supply voltage to be supplied after the shipment of the semiconductor integrated circuit.

Preferably, the process monitor circuit has a function started up from a test system outside this semiconductor integrated circuit and outputting the acquired extent of process variation to the outside of the semiconductor integrated circuit.

Preferably, the memory circuit is able to permanently store predetermined data and has a function for writing data into the memory circuit from a test system outside the semiconductor integrated circuit.

Preferably, the memory circuit stores data in accordance with the connection or disconnection state of a fuse.

Preferably, the memory circuit includes a nonvolatile memory.

Preferably, the data written into the memory circuit are data indicating the extent of process variation acquired from the process monitor circuit obtained on the basis of a test by the test system.

Preferably, the process monitor circuit includes a ring oscillator.

Preferably, the process monitor circuit has a plurality of circuit elements connected for propagating data and a delay measurement circuit for measuring data propagation delays of the circuit elements.

According to a second aspect of an embodiment of the present invention, there is provided a method of testing a semiconductor integrated circuit provided with a process monitor circuit for obtaining a grasp of a delay characteristic and having a mechanism for adaptively controlling a power supply voltage in accordance with an extent of process variation acquired by the process monitor circuit, having the steps of calculating the power supply voltage for the test in accordance with the extent of process variation and supplying the calculated power supply voltage for the test.

According to the present invention, for example, the extent of process variation is measured at the process monitor circuit provided in the semiconductor integrated circuit by an external test system. The data concerning the extent of process variation acquired by the process monitor circuit are written into a memory circuit provided in the semiconductor integrated circuit from, for example, the external test system. After shipment of the semiconductor integrated circuit, the data concerning the extent of process variation stored in the memory circuit are referred to by, for example, the power supply voltage control circuit, the power supply voltage to be supplied is calculated on the basis of this data, and the calculated power supply voltage is requested to the external power supply voltage device.

BRIEF DESCRIPTION OF THE DRAWINGS

These and other objects and features of the present invention will become clearer from the following description of the preferred embodiments given with reference to the attached drawings, wherein:

FIG. 6 is a block diagram of a semiconductor module employing a semiconductor integrated circuit according to a second embodiment of the present invention.

DESCRIPTION OF THE PREFERRED EMBODIMENTS

Below, an explanation will be given of the preferred embodiments of the present invention with reference to the drawings.

First Embodiment

Figure 1:
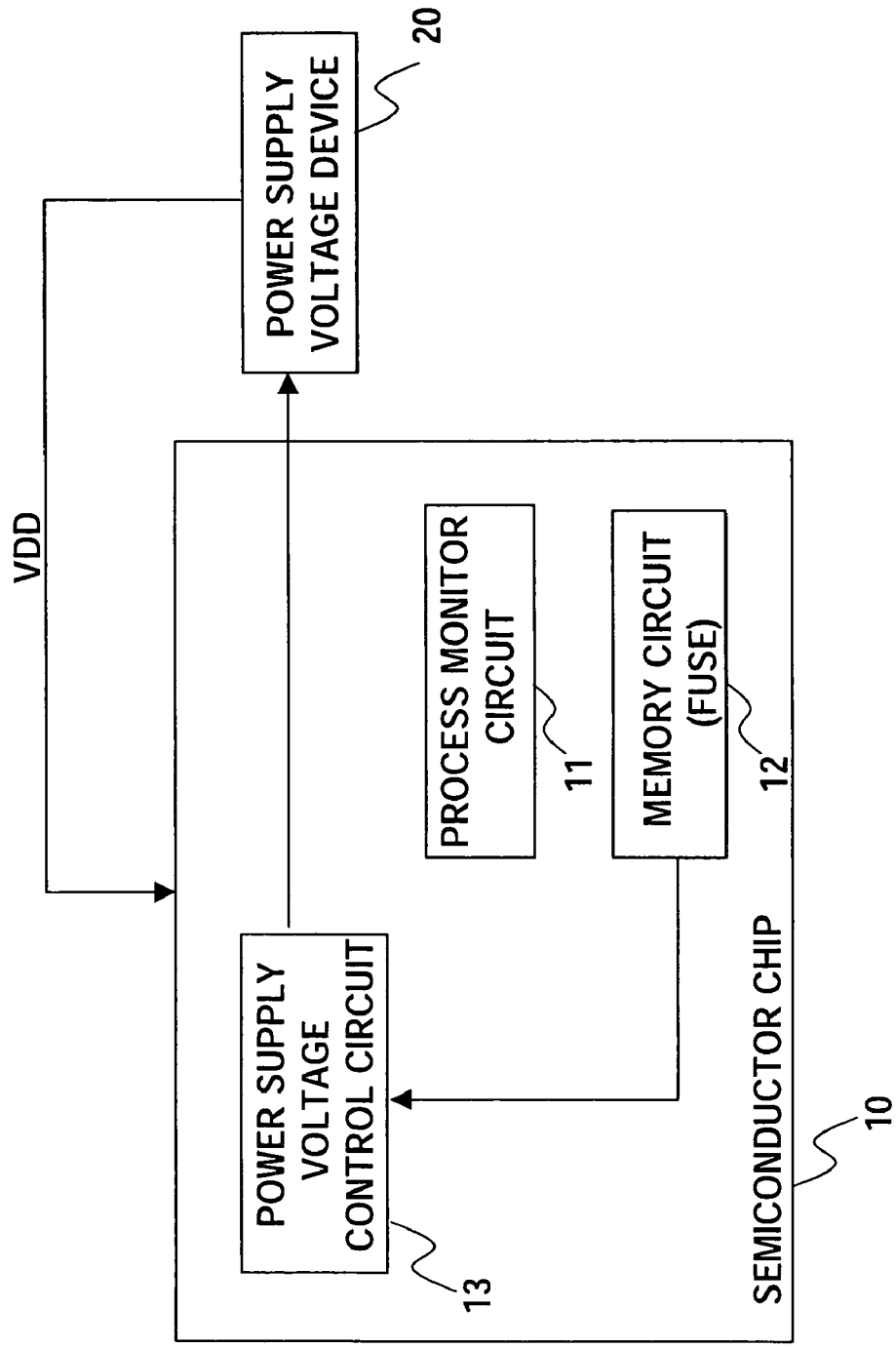
FIG. 1 is a block diagram of a semiconductor module employing a semiconductor integrated circuit according to a first embodiment of the present invention.
Figure 2:
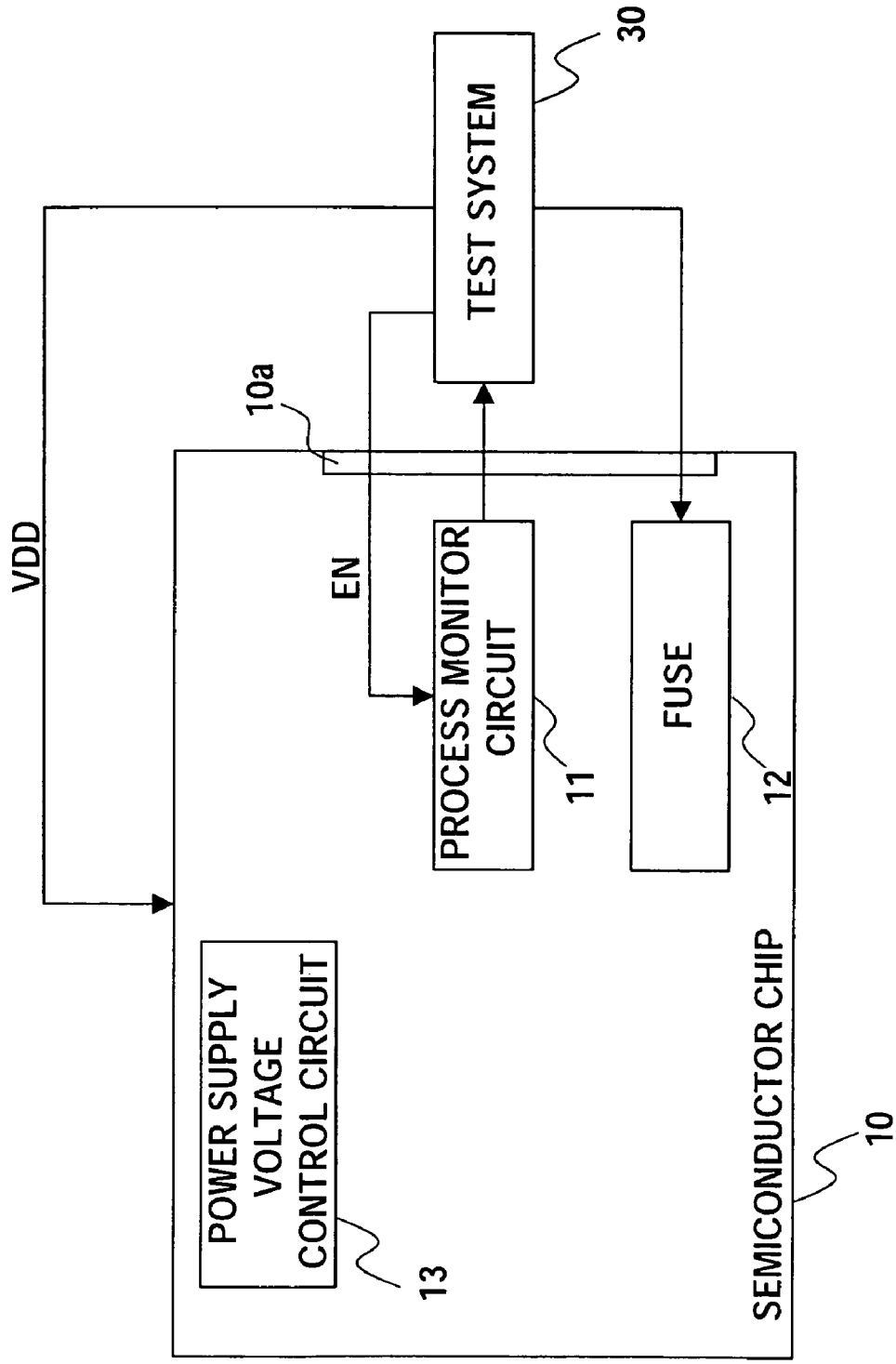
FIG. 2 is a block diagram of the configuration in the case where the semiconductor integrated circuit according to the first embodiment of the present invention is tested by an external test system.

FIG. 1 is a block diagram of a semiconductor module employing a semiconductor integrated circuit according to a first embodiment of the present invention. FIG. 2 is a block diagram of the configuration in the case where the semiconductor integrated circuit according to the first embodiment of the present invention is tested by an external test system.

The semiconductor module of FIG. 1 has a semiconductor chip 10 as a semiconductor integrated circuit and a power supply voltage device 20. Further, in FIG. 2, 30 indicates a test system.

The semiconductor chip 10, other than a not-illustrated function block operated by a power supply voltage VDD supplied by the power supply voltage device 20, has a process monitor circuit 11 for obtaining a grasp of a delay characteristic corresponding to the conditions of the production process, a memory circuit 12 for storing data concerning the extent of process variation acquired by the process monitor circuit 11, and a power supply voltage control circuit 13 for adaptively controlling the power supply voltage in accordance with the extent of process variation acquired by the process monitor circuit 11 and stored in the memory circuit 12.

The power supply voltage control circuit 13 has a function of reading the data written in the memory circuit 12, calculating the power supply voltage to be supplied, and requesting the calculated power supply voltage from the external power supply voltage device 20.

In the semiconductor chip 10, as shown in FIG. 2, the process monitor circuit 11 is provided with a function (mechanism) started up from the test system 30 outside the semiconductor chip 10 and outputting the acquired extent of process variation to the outside of the semiconductor chip 10, for example, the test system 30, as it is and a function for writing the data from the test system 30 to the memory circuit 12, for example, a connector 10a with the test system 30.

The process monitor circuit 11 generates a signal indicating a state of production of the semiconductor chip 10 (finished state) according to an enable signal EN supplied from the external test system 30 through the connector 10a and transfers the same through the connector 10a to the external test system 30. Further, the data written into the memory circuit 12 via the connector portion 10a are data indicating the extent of process variation acquired from the process monitor circuit 11 obtained on the basis of the test by the test system 30.

Figure 3:
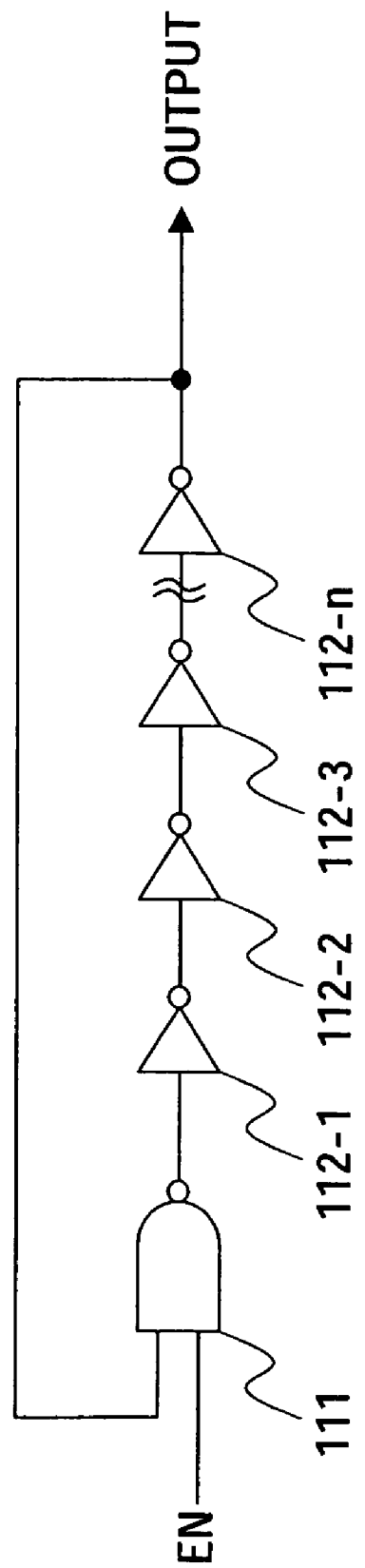
FIG. 3 is a circuit diagram of a first example of the configuration of a process monitor circuit according to this embodiment.

FIG. 3 is a circuit diagram of a first example of the configuration of a process monitor circuit 11 according to this embodiment.

A process monitor circuit 11A of FIG. 3 is configured to include a ring oscillator comprised of a 2-input NAND gate 111 and an even number of inverters 112-1, 112-2, ..., 112-n cascade connected to the output portion of the 2-input NAND gate 111 and feeding back part of the output of the inverter 112-n to one input terminal of the NAND gate 111. The enable signal EN from the test system 30 is input to the other input terminal of the NAND gate 111. It is also possible to output the output of the ring oscillator to an external terminal (connector 10a) of the semiconductor chip 10 as it is and make the test system 30 count the frequency. Further, when the oscillation frequency of the ring oscillator is very high, it is also possible to divide the frequency of the output oscillation clock, and then output the same to the outside of the semiconductor chip 10. Further, it is also possible to mount a frequency counter and output the frequency value counted by this.

The signal output from the ring oscillator configuring the process monitor circuit 11 and read into the test system 30 needs only to be one which enables the extent of variation of the semiconductor chip 10 to be learned. It is convenient if the number of external terminals is small and the signal is easy to read by the test system.

Figure 4:
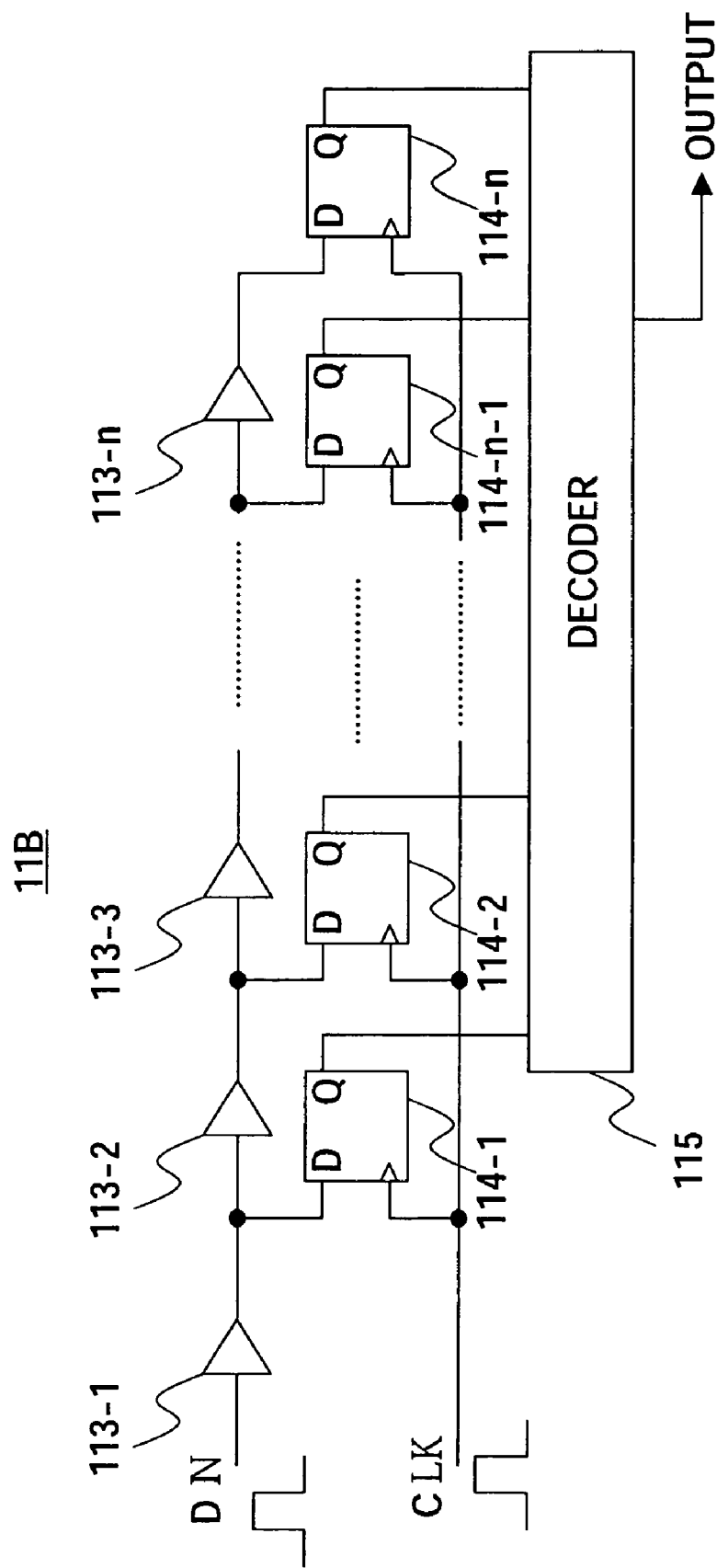
FIG. 4 is a circuit diagram of a second example of the configuration of a process monitor circuit according to this embodiment.

FIG. 4 is a circuit diagram of a second example of the configuration of a process monitor circuit 11 according to this embodiment. A process monitor circuit 11B of FIG. 4 is configured by a so-called pulse delay measurement circuit.

The process monitor circuit 11B of FIG. 4 has cascade-connected buffers 113-1, 113-2, ..., 113-n, latches 114-1, 114-2, ..., 114-n configured by D-type flip-flops, and a decoder 115.

The outputs of the buffers 113-1, 113-2, ..., 113-n are connected to the D-inputs of the corresponding latches 114-1, 114-2, ..., 114-n, clock terminals of the latches 114-1, 114-2, ..., 114-n are connected to a supply line of a clock CLK for supply, and Q-outputs of the latches 114-1, 114-2, ..., 114-n are input to the decoder 115.

In such a configuration, when a pulse DIN is input to the cascade-connected buffers 113-1, 113-2, ..., 113-n, the pulse is sequentially propagated. Then, when a measurement use pulse CLK is input after the elapse of a predetermined time from the input of the pulse DIN, the latches 114-1, 114-2, ..., 114-n connected in parallel to the buffers of the buffer train latch the output signals of the buffers all together. When the signals up to the mth stage have been propagated at the point of time of latching, in the output of the latch, m number of "1"s are arranged and (n-m) number of "0"s are arranged. By decoding this output at the decoder 115, the output signal is generated.

The memory circuit 12 has a configuration able, for example, to permanently store the data, for example, a configuration whereby data in accordance with the connection or disconnection state of a fuse is stored, and, as mentioned above, is configured so the test system 30 outside the semiconductor can write data into this memory circuit 12.

Figure 5:
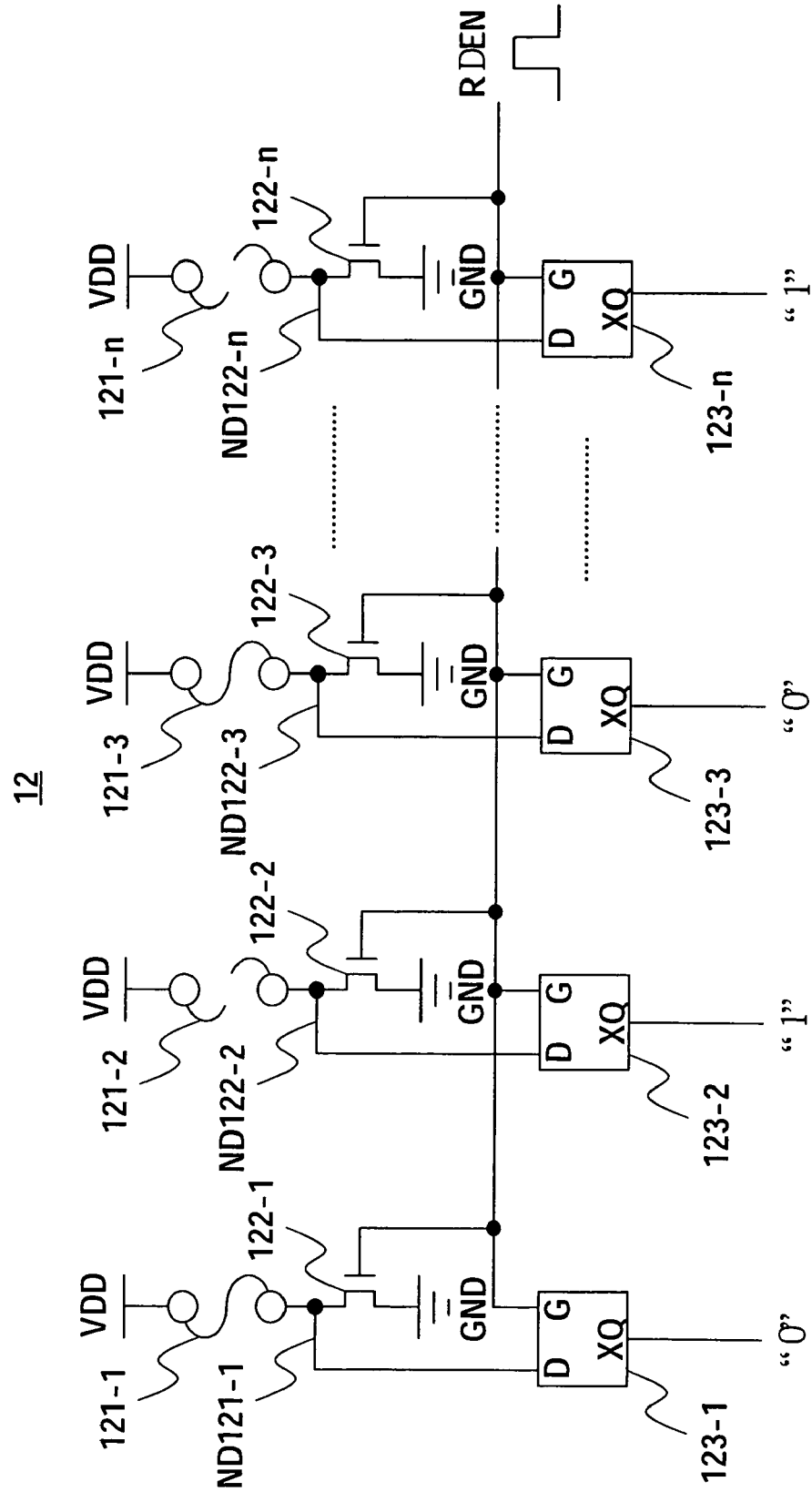
FIG. 5 is a circuit diagram of an example of the configuration of a memory circuit according to this embodiment.

FIG. 5 is a circuit diagram of an example of the configuration of the memory circuit 12 according to this embodiment and shows an example of the configuration of a memory circuit for storing data in accordance with the connection or disconnection state of a fuse.

A memory circuit 12A of FIG. 5 has fuses 121-1, 121-2, ..., 121-n, nMOS transistors 122-1, 122-2, ..., 122-n, and latches 123-1, 123-2, ..., 123-n and is configured so as to be able to be set with n bits of values.

First end sides of the fuses 121-1, 121-2, ..., 121-n are connected to a power supply potential VDD, while the other ends are connected to drains of corresponding nMOS transistors 122-1, 122-2, ..., 122-n and the D-inputs of the latches 123-1, 123-2, ..., 123-n. Sources of the nMOS transistors 122-1, 122-2, ..., 122-n are grounded, and gates are connected to the supply line of a read enable signal RDEN. Further, G-inputs of the latches 123-1, 123-2, ..., 123-n are connected to the supply line of the signal RDEN. The nMOS transistors 122-1, 122-2, ..., 122-n are designed so as to become high resistances due to the individual fuses. Further, the latches 123-1, 123-2, ..., 123-n output from the output XQ signals of levels inverted from the levels input to the D-inputs.

In such a configuration, the read enable signal RDEN is supplied from a not-illustrated decoder circuit, and the reading operation is carried out during a period where the enable signal RDEN is at a high level (H). When the enable signal RDEN is at the high level, an nMOS transistor 122-m becomes ON. Here, where a fuse 121-m is disconnected, a node ND121-m becomes the ground potential GND level due to the nMOS transistor 122-m. When the fuse 121-m is not disconnected, the fuse 121-m has a lower resistance than the nMOS transistor 122-m, so the node ND121-m becomes the power supply potential VDD level. When the enable signal RDEN is at a high level, the latch 123-m latches the value of the node ND121-m and outputs its inverted signal.

In the example of FIG. 5, the fuse 121-1 is not disconnected at the first bit, therefore, the node ND121-1 becomes the power supply potential VDD level, and the latch 123-1 outputs "0". Further, the fuse 121-1 is disconnected at the second bit, so the node ND121-2 becomes the ground potential GND level, and the latch 123-2 outputs "1".

Next, an explanation will be given of the operation by the above configuration with reference to FIG. 1 and FIG. 2.

As shown in FIG. 2, the process monitor circuit 11 generates a signal indicating the final state of the semiconductor chip 10 according to the enable signal EN from the test system 30. The generated signal is output to the outside of the semiconductor chip 10 and read by the test system 30. The test system 30 judges the extent of variation of the semiconductor chip 10 by the read signal and calculates the power supply voltage VDD to be supplied. The test system 30 supplies the power supply voltage VDD to the semiconductor chip 10, performs the test of a not-illustrated function block mounted on the semiconductor chip 10 in that state, and judges the quality. Simultaneously, the test system 30 writes the judgment result into the memory circuit 12 including, for example, a fuse circuit and mounted in the semiconductor chip 10.

Then, for example, after shipment, in the normal state of use, the power supply voltage control circuit 13 mounted on the semiconductor chip 10 reads out the information written in the memory circuit 12, calculates the power supply voltage to be supplied, and requests the voltage value thereof to the power supply voltage device 20. The power supply voltage device 20 supplies the power supply voltage VDD having the requested value to the semiconductor chip 10. By this, the semiconductor chip 10 accomplishes the requested function in the state where a power supply voltage VDD equivalent to the shipment test is supplied.

Note that, in this embodiment, an example of applying a circuit using fuse circuits as the memory circuit 12 was explained, but the memory circuit 12 needs only to be a permanent memory for notifying the result of judgment of the test system 30 to the power supply voltage control circuit 13. It can be a nonvolatile memory, such as a flash memory, as well. Further, the information written into the memory circuit 12 can be the value of the power supply voltage calculated by the test system 30 or data indicating the delay characteristic of the semiconductor chip 10. In this case, the power supply voltage control circuit 13 becomes able to perform higher grade control. Specifically, when the clock frequency driving the semiconductor chip 10 differs according to the set or usage state, it becomes possible to perform two-dimensional control of the extent of variation and the clock frequency. Further, if this judgment is programmable, it becomes possible to change the power supply voltage calculation algorithm to match with the set specifications after shipment of the semiconductor chip 10. This is great for the application.

As explained above, according to the first embodiment, in addition to the function block operating by the supply of the power supply voltage, the semiconductor chip (integrated circuit) 10 has a process monitor circuit 11 for obtaining a grasp of the delay characteristic in accordance with the conditions of the production process, a memory circuit 12 for storing data concerning the extent of process variation acquired by the process monitor circuit 11, and a power supply voltage control circuit 13 for adaptively controlling the power supply voltage in accordance with the extent of process variation acquired by the process monitor circuit 11 and stored in the memory circuit 12, so the following effects can be obtained.

Fluctuations in the production of semiconductor chips 10 can be measured, and the power supply voltage to be supplied can be adaptively controlled in accordance with the fluctuations in production, so the power consumption can be reduced. Further, the shipment test can be carried out with a power supply voltage corresponding to the fluctuations in production, the shipment test can be carried out with a power supply voltage under the same conditions as the usage condition, and it is possible to obtain a grasp of the final state of performance of individual semiconductor integrated circuits derived from fluctuations in production. Further, adaptive control of the power supply voltage is possible in accordance with the frequency of the clock supplied to the function block in the semiconductor integrated circuit. In addition, adaptive control of the power supply voltage is possible in accordance with the specifications of the product using the semiconductor integrated circuit.

Second Embodiment

FIG. 6 is a block diagram of a semiconductor module employing the semiconductor integrated circuit according to a second embodiment of the present invention.

The difference of the second embodiment from the first embodiment resides in that the power supply voltage control circuit 14A in the semiconductor chip 10A has the function of starting up the process monitor circuit 11 and reading the data of the extent of process variation acquired from the process monitor circuit 11 and the function of calculating the power supply voltage to be supplied on the basis of the data read out from the memory circuit 12 and the data read out from the process monitor circuit 11 and requesting the calculated power supply voltage to the external power supply voltage device 20.

Next, the operation in the second embodiment will be explained.

In the same way as the first embodiment, the power supply voltage control circuit 14A mounted in the semiconductor chip 10A calculates the power supply voltage to be supplied by reading the data (information) written in the memory circuit 12 and requests the voltage thereof to the power supply voltage device 20. Simultaneously with this, the power supply voltage control circuit 14 starts up the process monitor circuit 11 and reads the output signal. By this function, the power supply voltage control circuit 14A can acquire the delay characteristic of the semiconductor chip 10 even at the time of real operation and becomes able to control the power supply voltage in accordance with the deterioration of the semiconductor chip 10A and a change of the delay characteristic due to the temperature or other aspects of the usage environment.

According to the second embodiment, there is the advantage that control of the power supply voltage corresponding to deterioration, usage conditions, and usage environments is possible. Further, according to the second embodiment, in the same way as the first embodiment, fluctuations in the production of semiconductor chip 10 can be measured, and the power supply voltage supplied can be adaptively controlled in accordance with the fluctuations in production, so the power consumption can be reduced. Further, the shipment test can be carried out with a power supply voltage corresponding to the fluctuations in production, the shipment test can be carried out with a power supply voltage under the same conditions as the usage condition, and it is possible to obtain a grasp of the final state of performance of individual semiconductor integrated circuits derived from fluctuations in production. Further, adaptive control of the power supply voltage is possible in accordance with the frequency of the clock supplied to the function block in the semiconductor integrated circuit. In addition, adaptive control of the power supply voltage is possible in accordance with the specifications of the product using the semiconductor integrated circuit.

Summarizing the effects of the invention, according to the present embodiment, fluctuations in the production of semiconductor integrated circuits can be measured, and the power supply voltage supplied can be adaptively controlled in accordance with the fluctuations in production, so the power consumption can be reduced. Further, the shipment test can be carried out with a power supply voltage corresponding to the fluctuations in production, the shipment test can be carried out with a power supply voltage under the same conditions as the usage condition, and it is possible to obtain a grasp of the final state of performance of individual semiconductor integrated circuits derived from fluctuations in production. Further, the control of the power supply voltage corresponding to deterioration, usage conditions, and usage environments is possible. Still further, adaptive control of the power supply voltage is possible in accordance with the frequency of the clock supplied to the function block in the semiconductor integrated circuit. In addition, adaptive control of the power supply voltage is possible in accordance with the specifications of the product using the semiconductor integrated circuit.

It should be understood by those skilled in the art that various modifications, combinations, subcombinations and alterations may occur depending on design requirements and other factors insofar as they are within the scope of the appended claims or the equivalents thereof.

We claim:

1. A semiconductor integrated circuit operating by the supply of a power supply voltage, comprising:
   a process monitor circuit for obtaining a determining of a delay characteristic corresponding to conditions of the production process,
   a memory circuit for storing data relating to an extent of process variation acquired by the process monitor circuit, and a power supply voltage control circuit for adaptively controlling the power supply voltage in accordance with the extent of process variation acquired by the process monitor circuit and stored in the memory circuit, wherein:

a clock of predetermined frequency is supplied, and the power supply voltage control circuit calculates the power supply voltage to be supplied from the clock frequency supplied to the semiconductor integrated circuit in addition to the data written in the memory circuit.

2. The semiconductor integrated circuit as set forth in claim 1, wherein the power supply voltage control circuit has a function of reading the data written in the memory circuit, calculating the power supply voltage to be supplied, and requesting the calculated power supply voltage to an external power supply voltage device.

3. The semiconductor integrated circuit as set forth in claim 1, wherein the power supply voltage control circuit has a function of starting up the process monitor circuit and reading the data of the extent of process variation acquired from the process monitor circuit and has a function of calculating the power supply voltage to be supplied on the basis of the data read out from the memory circuit and the data read out from the process monitor circuit and requesting the calculated power supply voltage to the external power supply voltage device.

4. The semiconductor integrated circuit as set forth in claim 2, wherein the power supply voltage control circuit is programmable and able to be changed in the processing for calculating the power supply voltage to be supplied after the shipment of the semiconductor integrated circuit.

5. The semiconductor integrated circuit as set forth in claim 3, wherein the power supply voltage control circuit is programmable and able to be changed in the processing for calculating the power supply voltage to be supplied after the shipment of the semiconductor integrated circuit.

6. A semiconductor integrated circuit operating by the supply of a power supply voltage, comprising:

a process monitor circuit for obtaining a determining of a delay characteristic corresponding to conditions of the production process, a memory circuit for storing data relating to an extent of process variation acquired by the process monitor circuit, and a power supply voltage control circuit for adaptively controlling the power supply voltage in accordance with the extent of process variation acquired by the process monitor circuit and stored in the memory circuit, wherein the process monitor circuit has a function started up from a test system outside the semiconductor integrated circuit and outputting the acquired extent of process variation to the outside of the semiconductor integrated circuit.

7. The semiconductor integrated circuit as set forth in claim 6, wherein the memory circuit is able to permanently store predetermined data and has a function writing data into the memory circuit from a test system outside the semiconductor integrated circuit.

8. The semiconductor integrated circuit as set forth in claim 7, wherein the memory circuit stores data in accordance with a connection or disconnection state of a fuse.

9. The semiconductor integrated circuit as set forth in claim 7, wherein the memory circuit includes a nonvolatile memory.

10. The semiconductor integrated circuit as set forth in claim 7, wherein the data written into the memory circuit is data indicating the extent of process variation acquired from the process monitor circuit obtained on the basis of a test by the test system.

11. The semiconductor integrated circuit as set forth in claim 1, wherein the process monitor circuit includes a ring oscillator.

12. The semiconductor integrated circuit as set forth in claim 6, wherein the process monitor circuit includes a ring oscillator.

13. The semiconductor integrated circuit as set forth in claim 1, wherein the process monitor circuit comprises:

a plurality of circuit elements connected for propagating data and a delay measurement circuit for measuring data propagation delays of the circuit elements.

14. The semiconductor integrated circuit as set forth in claim 6, wherein the process monitor circuit comprises:

a plurality of circuit elements connected for propagating data and a delay measurement circuit for measuring data propagation delays of the circuit elements.

15. A method of testing a semiconductor integrated circuit, the method comprising the steps of:

obtaining a determining of a delay characteristic corresponding to conditions of a production process;

storing data relating to an extent of process variation acquired by a process monitor circuit;

adaptively controlling a power supply voltage in accordance with an extent of process variation acquired by the process monitor circuit and stored;

supplying a clock of predetermined frequency;

calculating the power supply voltage to be supplied from the data and the clock.

* * * * *